United States Patent
Wang et al.

(10) Patent No.: US 12,268,026 B2
(45) Date of Patent: Apr. 1, 2025

(54) HIGH ASPECT RATIO CONTACT STRUCTURE WITH MULTIPLE METAL STACKS

(71) Applicant: International Business Machines Corporation, Armonk, NY (US)

(72) Inventors: Junli Wang, Slingerlands, NY (US); Brent A Anderson, Jericho, VT (US); Terence Hook, Jericho Center, VT (US); Indira Seshadri, Niskayuna, NY (US); Albert M. Young, Fishkill, NY (US); Stuart Sieg, Albany, NY (US); Su Chen Fan, Cohoes, NY (US); Shogo Mochizuki, Mechanicville, NY (US)

(73) Assignee: International Business Machines Corporation, Armonk, NY (US)

( * ) Notice: Subject to any disclaimer, the term of this patent is extended or adjusted under 35 U.S.C. 154(b) by 381 days.

(21) Appl. No.: 17/657,006

(22) Filed: Mar. 29, 2022

(65) Prior Publication Data
US 2023/0317802 A1    Oct. 5, 2023

(51) Int. Cl.
*H10D 64/23*    (2025.01)
*H10D 64/01*    (2025.01)

(52) U.S. Cl.
CPC ........... *H10D 64/251* (2025.01); *H10D 64/01* (2025.01)

(58) Field of Classification Search
None
See application file for complete search history.

(56) References Cited

U.S. PATENT DOCUMENTS

| | | | |
|---|---|---|---|
| 8,536,656 | B2 | 9/2013 | Ramachandran |
| 8,841,711 | B1 | 9/2014 | Cai |
| 9,054,178 | B2 | 6/2015 | Bohr |
| 9,929,046 | B2 | 3/2018 | Cheng |
| 10,242,982 | B2 | 3/2019 | Ruilong |
| 10,312,188 | B1* | 6/2019 | Srivastava ............ H01L 23/528 |
| 10,832,964 | B1 | 11/2020 | Xie |
| 2017/0162444 | A1* | 6/2017 | Ok ...................... H01L 29/0649 |
| 2021/0134660 | A1* | 5/2021 | Wang ................ H01L 21/76825 |

FOREIGN PATENT DOCUMENTS

TW    673791 B    10/2019

OTHER PUBLICATIONS

Lee, et al., "Inner Spacer Engineering to Improve Mechanical Stability in Channel-Release Process of Nanosheet FETs", Electronics 2021, 10, 1395, 7 pages.
Undisclosed, IP.com No. IPCOM000258215D, "Semiconductor Device and Method for Enabling Low Contact Resistance", Apr. 18, 2019, 4 pages.

* cited by examiner

*Primary Examiner* — Hsien Ming Lee
(74) *Attorney, Agent, or Firm* — Yuanmin Cai

(57) ABSTRACT

A high aspect ratio contact structure formed within a dielectric material includes a top portion and a bottom portion. The top portion of the contact structure includes a tapering profile towards the bottom portion. A first metal stack surrounded by an inner spacer is located within the top portion of the contact structure and a second metal stack is located within the bottom portion of the contact structure. A width of the bottom portion of the contact structure is greater than a minimum width of the top portion of the contact structure.

20 Claims, 3 Drawing Sheets

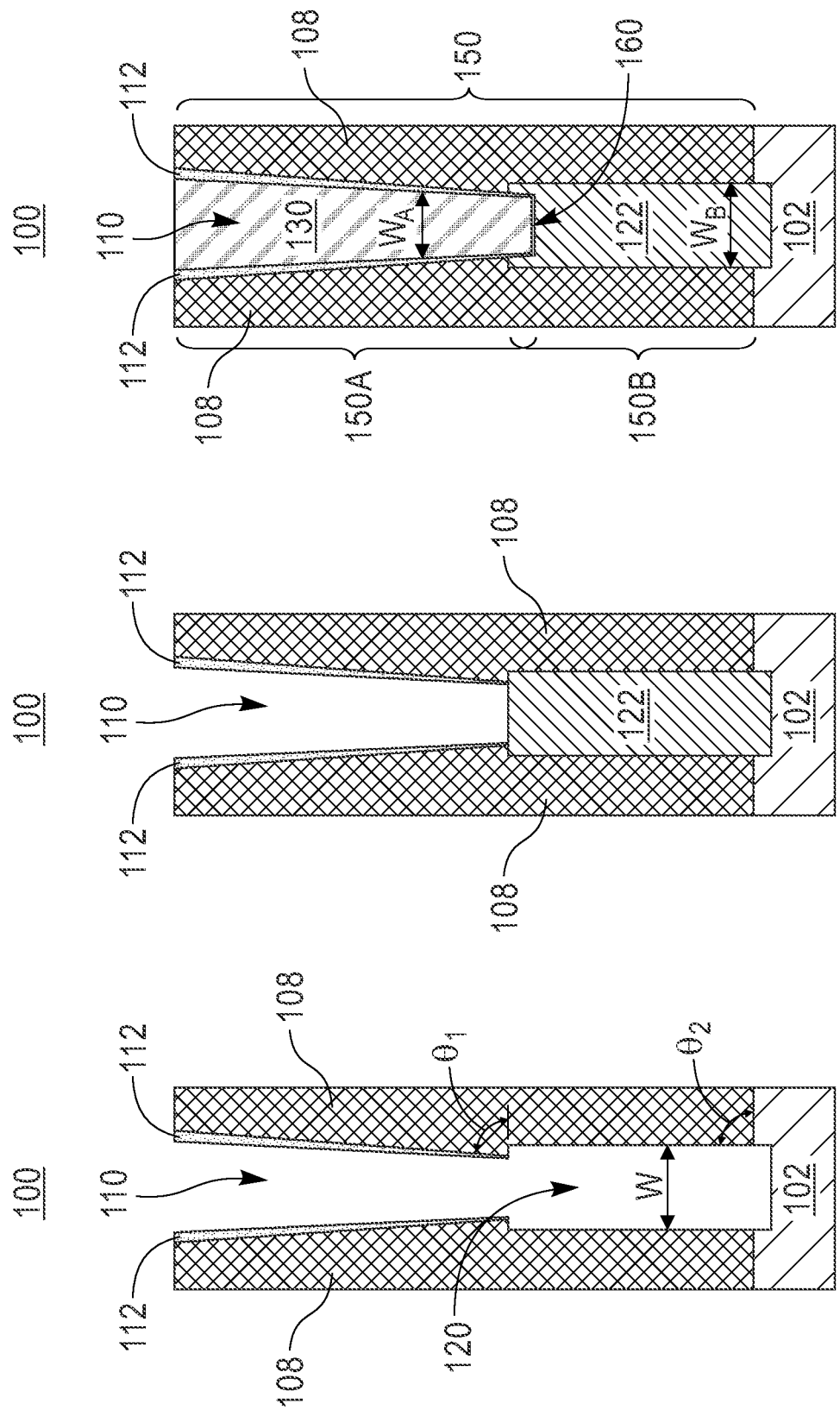

200

Conducting a first etching process within a
dielectric material to form a first contact trench,
the first contact trench being at a first taper angle
210

↓

Depositing an inner spacer on sidewalls of the
dielectric material exposed by the first contact trench
220

↓

Conducting a second etching process to form a
second contact trench below the first contact trench
230

↓

Conducting a third etching process to horizontally
extend the second contact trench, the second contact
trench being at a second taper angle
240

↓

Forming a second metal stack within the second
contact trench and a first metal stack within the
first contact trench
250

FIG. 2

HIGH ASPECT RATIO CONTACT STRUCTURE WITH MULTIPLE METAL STACKS

BACKGROUND

The present invention generally relates to the field of complementary metal-oxide semiconductors (CMOS), and more particularly to forming high aspect ratio contact structures in vertically stacked field-effect transistors (FETs).

Stacking FETs in the vertical direction provides an additional dimension for CMOS area scaling. Stacked FETs extend the chip structure to three dimensions and increase the number of CMOS devices that can be formed into a given footprint. However, formation of electrical connections within vertically stacked three-dimensional (3D) devices require contact structures with very high aspect ratio (A/R), which can pose numerous challenges during device manufacturing.

SUMMARY

According to an embodiment of the present disclosure, a semiconductor structure includes a contact structure within a dielectric material, the contact structure includes a top portion and a bottom portion. The top portion of the contact structure includes a tapering profile towards the bottom portion. A first metal stack surrounded by an inner spacer is located within the top portion of the contact structure, and a second metal stack is located within the bottom portion of the contact structure. A maximum width of the bottom portion of the contact structure is greater than a minimum width of the top portion of the contact structure.

According to another embodiment of the present disclosure, a method of forming a semiconductor structure includes forming a contact structure within a dielectric material, the contact structure including a top portion and a bottom portion, the top portion including a tapering profile towards the bottom portion, a maximum width of the bottom portion of the contact structure is greater than a minimum width of the top portion of the contact structure, depositing a second metal stack within the bottom portion of the contact structure, and depositing a first metal stack within the top portion of the contact structure, the first metal stack being surrounded by an inner spacer.

BRIEF DESCRIPTION OF THE DRAWINGS

The following detailed description, given by way of example and not intended to limit the invention solely thereto, will best be appreciated in conjunction with the accompanying drawings, in which:

FIG. 1D is a cross-sectional view of the semiconductor structure after conducting a third etch process, according to an embodiment of the present disclosure;

FIG. 1E is a cross-sectional view of the semiconductor structure after forming a first metal stack, according to an embodiment of the present disclosure;

FIG. 1F is a cross-sectional view of the semiconductor structure after forming a second metal stack, according to an embodiment of the present disclosure; and FIG. 2 is a flowchart depicting operational steps for the fabrication of the semiconductor structure according to an embodiment of the present disclosure.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1C:
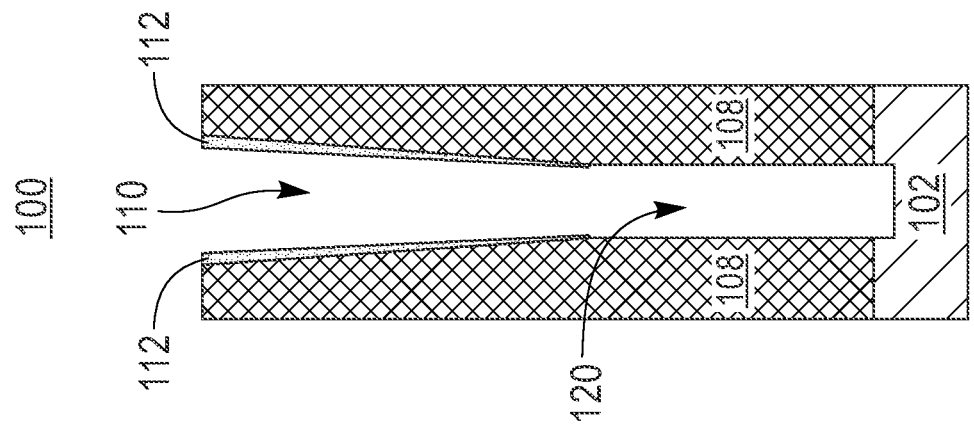
FIG. 1C is a cross-sectional view of the semiconductor structure after forming a second contact trench, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Stacking FETs in the vertical direction provides an additional dimension for CMOS area scaling. Stacked FETs extend the chip structure to three dimensions and increase the number of CMOS devices that can be formed into a given footprint. However, very high aspect ratio (A/R) contact structures are required to form electrical connections between, for example, a bottom device contact and a via/$M_1$ level, or between a top device contact and backside metals. In some instances, the bottom critical dimension (CD) of such contact structures may be around or less than 10 nm, while the total length may be over 100 nm. This long and narrow contact configuration can cause patterning, metal fill, and resistance challenges during device manufacturing.

Therefore, embodiments of the present disclosure provides a high A/R contact structure, and a method of making the same, in which a top portion of the contact structure includes a top metal stack self-aligned (i.e., centered) to a bottom metal stack included in a bottom portion of the contact structure. Each of the top and bottom portions of the contact structure may include single or multiple layers of analogous or different materials, and may be surrounded by the same or different dielectric material. More particularly, in an embodiment, the top portion of the contact structure is at a first taper angle, while the bottom portion of the contact structure is at a second taper angle that is different from the first taper angle and has a greater (bottom) width than the top portion, the wider bottom portion may increase a contact area between the contact structure and underlying active regions (e.g., bottom source-drain epitaxy) of the device.

An embodiment by which the high A/R contact structure can be formed in stacked 3D devices is described in detailed below by referring to the accompanying drawings in FIGS. 1A-2.

Figure 1B:
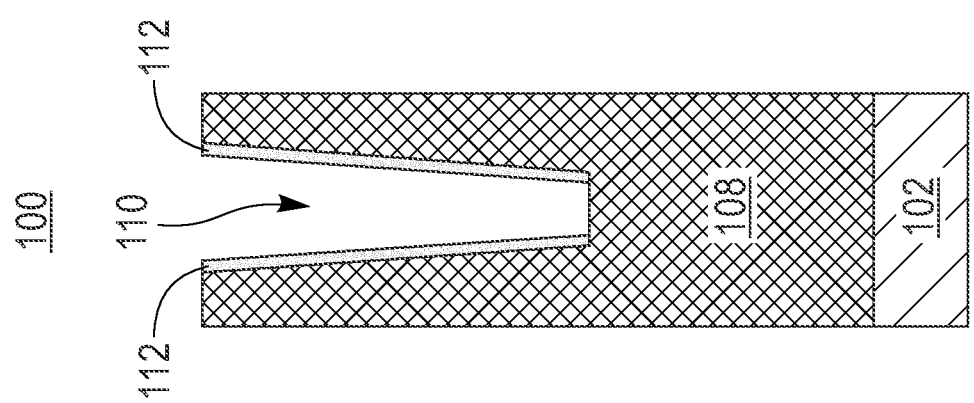
FIG. 1B is a cross-sectional view of the semiconductor structure after forming an inner spacer, according to an embodiment of the present disclosure.
Figure 1A:
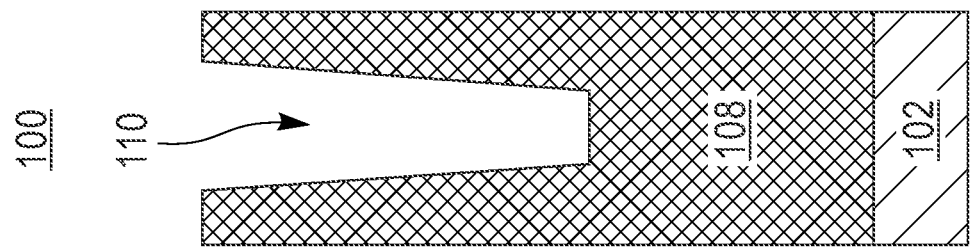
FIG. 1A is a cross-sectional view of a memory device at an intermediate step during a semiconductor manufacturing process, according to an embodiment of the present disclosure.

Referring now to FIG. 1A, a cross-sectional view of a semiconductor structure 100 at an intermediate step during a semiconductor manufacturing process is shown, according to an embodiment of the present disclosure. In this embodiment, the semiconductor structure 100 includes a simplistically depicted vertically stacked CMOS device. More particularly, for ease of illustration, without intent of limitation, FIGS. 1A-1F depict an area of the semiconductor structure 100 in which an electrical connection to an active region 102 is formed. The active region 102 represents a landing area for a subsequently formed electrically conductive structure.

In one or more embodiments, the active region 102 may include a silicon-containing structure or a metal-containing structure. For example, in an embodiment, the active region 102 may be a top source-drain (epitaxial) region, a bottom source-drain (epitaxial) region or a metal gate formed in the semiconductor structure 100.

Known semiconductor fabrication operations have been used to form the semiconductor structure 100. Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

It should be noted that the active region 102 is not intended to be limited and can represent front end of line (FEOL) components. FEOL generally refers to the construction of the components of the IC directly inside the wafer. In some embodiments, the active region 102 may also include an inter-layer dielectric and various circuit components, ground terminals, and/or power terminals. Further, the active region 102 is herein illustrated as a single layer to simplify the drawings and explanation, since all such additional components are not relevant to this invention.

As depicted in FIG. 1A, the semiconductor structure 100 further includes a first dielectric layer 108 disposed above the active region 102. In one or more embodiments, the first dielectric layer 108 may be formed to fill voids between gate structures and other existing devices within the semiconductor structure 100. The first dielectric layer 108 may be formed by, for example, chemical vapor deposition (CVD) of a dielectric material. Non-limiting examples of dielectric materials to form the first dielectric layer 108 may include silicon oxide, silicon nitride, hydrogenated silicon carbon oxide, silicon based low-k dielectrics, flowable oxides, porous dielectrics, or organic dielectrics including porous organic dielectrics.

After deposition of the first dielectric layer 108, a chemical mechanical polishing (CMP) process can be conducted on the semiconductor structure 100. After this step, a first etching process is conducted on the first dielectric layer 108 to form a first contact trench 110. As known by those skilled in the art, patterning of the first dielectric layer 108 to form the first contact trench 110 involves exposing a pattern (not shown) on a photoresist layer (not shown) and transferring the exposed pattern to the first dielectric layer 108 using a suitable etching technique (e.g., RIE). After transferring the pattern and forming the first contact trench 110, the photoresist layer (not shown) can be removed using any photoresist striping method known in the art including, for example, plasma ashing.

In this embodiment, the first etching process is conducted on a top portion of the first dielectric layer 108 to form a first contact trench 110, as shown in the figure. The first contact trench 110 may be formed with a taper angle varying between approximately 85 degrees to approximately 90 degrees, and ranges therebetween. More specifically, the first contact trench 110 exposes sidewalls of the first dielectric layer 108 and each of the sidewalls of the first dielectric layer 108 is angled with respect to a top (horizontal) surface of the active region 102 in a way such that the first contact trench 110 becomes gradually narrower towards the top surface of the active region 102.

Referring now to FIG. 1B, a cross-sectional view of a semiconductor structure 100 is shown after forming an inner spacer 112, according to an embodiment of the present disclosure.

The inner spacer 112 is formed within the first contact trench 110. Specifically, the inner spacer 112 substantially covers sidewalls of the first dielectric layer 108 exposed by the first trench 110. It should be noted that an etching process has been conducted on the semiconductor structure 100 to remove a horizontal portion (not shown) of the inner spacer 112 formed on a bottom portion of the first trench 110 above the first dielectric layer 108. The inner spacer 112 may allow subsequently conducting one or more etch processes within the first dielectric layer 108, as will be described in detail below.

In one or more embodiments, the inner spacer 112 can include a liner layer of a dielectric material such as, for example, SiN, SiC, SiOC, SiCN, BN, SiBN, SiBCN, SiOCN, SiOxNy, and combinations thereof. The dielectric material forming the inner spacer 112 can be a low-k material having a dielectric constant less than about 7, less than about 5, or even less than about 2.5. The inner spacer 112 can be formed using combinations of known deposition and etching processes, such as, for example, chemical vapor deposition (CVD), plasma-enhanced chemical vapor deposition (PECVD), atomic layer deposition (ALD), physical vapor deposition (PVD), chemical solution deposition, and etching processes including reactive ion etch (RIE), wet etch, or isotropic vapor phased dry etch.

Referring now to FIG. 1C, a cross-sectional view of a semiconductor structure 100 is shown after forming a second contact trench 120, according to an embodiment of the present disclosure.

In this embodiment, a second etch process can be conducted on the first dielectric layer 108. More particularly, the second etch process extends a depth of the first contact trench 110 until a bottom portion of the first dielectric layer 108. Stated differently, during the second etch process the second contact trench 120 is formed within the bottom portion of the first dielectric layer 108 located below the first contact trench 110. In an embodiment, the second contact trench 120 extends within an uppermost portion of the active region 102. In other embodiments, the second etch process is conducted until a top surface of the active region 102 is exposed by the second contact trench 120.

Referring now to FIG. 1D, a cross-sectional view of a semiconductor structure 100 is shown after conducting a third etch process for horizontally extending a width w of the second contact trench, according to an embodiment of the present disclosure.

In this embodiment, the third etch process includes an isotropic etch. As known by those skilled in the art, isotropic etching results in equal etch rates in all directions. Thus, in one or more embodiments, a second taper angle $\theta_2$ of the second trench 120 is different from a first taper angle $\theta_1$ of the first contact trench 110. The first and second taper angles $\theta_1$, $\theta_2$ are measured with respect to a horizontal plane parallel to the active region 102. In an exemplary embodiment, the first taper angle $\theta_1$ is less than the second taper angle $\theta_2$. As depicted in the figure, the second taper angle $\theta_2$ may be approximately 90 degrees. Accordingly, the second contact trench 120 has a substantially vertical taper, i.e., the second contact trench 120 maintains a substantially constant diameter from top to bottom. The first contact trench 110 and the second contact trench 120 form a high aspect ratio contact trench that allows forming a high aspect ratio contact structure for electrically connecting the active region 102 to subsequently formed devices or conductive levels.

Referring now to FIG. 1E, a cross-sectional view of a semiconductor structure 100 is shown after forming a second metal stack 122 within the second contact trench 120 (FIG. 1D), according to an embodiment of the present disclosure.

In this embodiment, the second metal stack 122 is formed by depositing, from a bottom portion to a top portion of the second trench 120 (FIG. 1D), layers of a second conductive material or a combination of conductive materials. Non-limiting examples of deposition process to form the second conductive material may include bottom-up selective metal growth processes such as ALD or CVD. The second conductive material forming the second metal stack 122 substantially fills the second contact trench 120 (FIG. 1D). The second conductive material filling the second contact trench 120 (FIG. 1D) may include a conductive metal such as, for example, cobalt (Co), ruthenium (Ru), copper (Cu), or any combination thereof. It should be noted that, in some embodiments, the second metal stack 122 may further include an adhesion metal liner or second conformal metal liner interface (not shown) formed before the second conductive material. In such embodiments, the second conformal metal liner interface (not shown) may include a layer of TiN, TaN, or the like.

Referring now to FIG. 1F, a cross-sectional view of a semiconductor structure 100 is shown after forming a first metal stack 130 within the first contact trench 110 (FIG. 1E), according to an embodiment of the present disclosure.

In this embodiment, the first metal stack 130 is formed by depositing a first conductive material or a combination of conductive materials within the first contact trench 110 (FIG. 1E). The first conductive material may be deposited by any suitable deposition process including, for example, CVD, PECVD, PVD, plating, thermal or e-beam evaporation, or sputtering. The first conductive material forming the first metal stack 130 may include a conductive metal such as, for example, tungsten (W), cobalt (Co), ruthenium (Ru), copper (Cu), or any combination thereof. It should be noted that, in some embodiments, the first metal stack 130 may further include an adhesion metal liner or first conformal metal liner interface (not shown) formed before depositing the first conductive material. In such embodiments, the first conformal metal liner interface (not shown) may include a layer of TiN, TaN, or the like. A planarization process such as CMP can be conducted to remove any conductive material from surfaces of the semiconductor structure 100. It should be noted that the first metal stack 130 is formed in direct contact with the inner spacer 112.

It should also be noted that the inner spacer 112 may prevent top CD blow-up during the bottom trench (i.e., second trench 120) trimming. In some embodiments, the inner spacer 112 can be removed before the metal fill. However, in most cases the inner spacer 112 remains in the semiconductor structure 100 to provide a well-defined CD control. In embodiments in which the inner spacer 112 includes a robust material, the inner spacer 112 can prevent shorting or electrical breakdown between the contact structure 150 and adjacent contact structures or between the contact structure 150 and other conductive materials.

According to an embodiment, the semiconductor structure 100, as depicted in FIG. 1F, includes a high aspect ratio contact structure 150 composed of a top portion 150A and a bottom portion 150B. The top portion 150A including a tapering profile towards the bottom portion 150B. Specifically, the top portion 150A is at a first taper angle $\theta_1$, depicted in FIG. 1D, while the bottom portion 150B is at a second taper angle $\theta_2$, also depicted in FIG. 1D. The top portion 150A further includes the first metal stack 130 surrounded by the inner spacer 112. The bottom portion 150B further includes the second metal stack 122. In one or more embodiments, a bottom surface 160 of the top portion 150A (i.e., an interface between the top portion 150A and the bottom portion 150B) is located below a lowermost portion of the inner spacer 112, i.e., the bottom surface 160 of the top portion 150A extends within the bottom portion 150B (as shown in FIG. 1F). In other embodiments, the bottom surface 160 of the top portion 150A is coplanar with the lowermost portion of the inner spacer 112 and an uppermost surface of the bottom portion 150B of the contact structure 150. In the proposed embodiments, a maximum width WB of the bottom portion 150B of the contact structure 150 is greater than a minimum width WA of the bottom surface 160 of the top portion 150A.

As may be understood, taperness can be defined as the difference between a bottom critical dimension (CD) and a top CD, i.e., taperness=bottom CD−top CD. In some instances, it is desirable that this difference can be as close to zero as possible. As can be observed in FIGS. 1D-1F, the two-step etching process provides better taperness (i.e., closer to zero) in the bottom portion 150B of the of the contact structure 150.

Thus, the proposed embodiments provide a high aspect ratio contact structure 150, and a method of making the same, involving a two-step etching process, significantly different from typical dual damascene process, that facilitates contact patterning and metal fill and reduces the risk of contact to top FET shorts. This may result in a more robust high aspect ratio contact structure capable of enabling further CMOS scaling without sacrificing device performance and reliability.

Referring now to FIG. 2, a flowchart 200 sets forth operational steps for the fabrication of a high aspect ratio contact structure within vertically stacked CMOS devices, according to an embodiment of the present disclosure.

At step 210, a first etching process is conducted within a dielectric material to form a first contact trench. The first contact trench being at a first taper angle.

At step 220, an inner spacer is deposited on sidewalls of the dielectric material exposed by the first contact trench. In an embodiment, the inner spacer is formed by a dielectric spacer material such as SiN.

At step 230, a second etching process is conducted to form a second contact trench below the first contact trench. In an embodiment, the second etching process is conducted until the second contact trench exposes an uppermost surface of an underlying active region.

At step 240, a third etching process is conducted to horizontally extend the second contact trench. According to an embodiment, the third etching process includes an isotropic etch. After the third etching process, the second contact trench is at a second taper angle that is different from the first taper angle. In an embodiment, the first taper angle is less than the second taper angle.

At step 250, a second (or bottom) metal stack is deposited from bottom to top within the second contact trench and a first (or top) metal stack is subsequently deposited within the first contact trench. The second metal stack formed within the second contact trench defines a bottom portion of the high aspect ratio contact structure, while the first metal stack formed within the first contact trench and surrounded by the inner spacer defines a top portion of the high aspect ratio contact structure. In one or more embodiments, a maximum width of the bottom portion of the high aspect ratio contact structure is greater than a minimum width of the top portion of the high aspect ratio contact structure.

In some embodiments, an interface between the top portion and the bottom portion of the contact structure is located below a bottom surface of the inner spacer. In other embodiments, the interface between the top portion and the bottom portion of the contact structure is coplanar with the bottom surface of the inner spacer and an uppermost surface of the bottom portion of the contact structure. In one or more embodiments, the maximum width of the bottom portion of the contact structure is greater than a width of the interface between the top portion and the bottom portion of the contact structure.

In some embodiments, the first metal stack further includes a first conformal metal liner interface and the second metal stack further includes a second conformal metal liner interface. The second metal stack includes one or more layers of conductive materials.

In some embodiments, the first metal stack includes one or more layers of conductive materials similar to those forming the second metal stack. In other embodiments, the first metal stack and the second metal stack include different conductive materials.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which includes one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a contact structure within a dielectric material, the contact structure including a top portion in a first contact trench, the first contact trench having a straight sidewall from a top to a bottom of the first contact trench, and a bottom portion in a second contact trench, the second contact trench being below the first contact trench and extended horizontally from the first contact trench, and the top portion of the contact structure including a tapering profile towards the bottom portion;
a first metal stack within the top portion of the contact structure;
a second metal stack within the bottom portion of the contact structure, the second metal stack filling the second contact trench from a bottom to a top of the second contact trench; and
an inner spacer surrounding the first metal stack from a top to a bottom of the first metal stack, wherein a maximum width of the bottom portion of the contact structure is greater than a minimum width of the top portion of the contact structure.

2. The semiconductor structure of claim 1, wherein the first metal stack is different in material from the second metal stack.

3. The semiconductor structure of claim 1, wherein the first metal stack further comprises a first conformal metal liner interface.

4. The semiconductor structure of claim 1, wherein the second metal stack comprises one or more layers of conductive materials.

5. The semiconductor structure of claim 1, wherein the second metal stack further comprises a second conformal metal liner interface.

6. The semiconductor structure of claim 1, wherein a taper angle of the top portion of the contact structure is less than a taper angle of the bottom portion measured from a horizontal plane.

7. The semiconductor structure of claim 1, wherein the inner spacer comprises a dielectric spacer material.

8. The semiconductor structure of claim 1, wherein an interface between the top portion and the bottom portion of the contact structure is located below a bottom surface of the inner spacer.

9. The semiconductor structure of claim 8, wherein the maximum width of the bottom portion of the contact structure is greater than a width of the interface between the top portion and the bottom portion of the contact structure.

10. The semiconductor structure of claim 1, wherein an interface between the top portion and the bottom portion of the contact structure is coplanar with a bottom surface of the inner spacer and an uppermost surface of the bottom portion of the contact structure.

11. A method of forming a semiconductor structure, comprising:
forming a contact structure within a dielectric material, the contact structure including a top portion and a bottom portion, the top portion including a tapering profile towards the bottom portion, wherein forming the contact structure further comprises:
conducting a first etching process within the dielectric material to form a first contact trench having a straight sidewall from a top to a bottom of the first contact trench;
depositing an inner spacer on the straight sidewall from the top to the bottom of the first contact trench;
conducting a second etching process to form a second contact trench below the first contact trench, wherein the second etching process is conducted until the second contact trench exposes an uppermost surface of an underlying active region; and
conducting a third etching process to horizontally extend the second contact trench;
depositing a second metal stack within the bottom portion of the contact structure and from a bottom to a top of the second contact trench; and
depositing a first metal stack within the top portion of the contact structure and within the first contact trench, the first metal stack being in contact with and surrounded by the inner spacer, wherein a maximum width of the bottom portion of the contact structure is greater than a minimum width of the top portion of the contact structure.

12. The method of claim 11, wherein the first metal stack further comprises a first conformal metal liner interface, the first metal stack being different in material from the second metal stack.

13. The method of claim 11, wherein the second metal stack further comprises a second conformal metal liner interface, the second metal stack comprising one or more layers of conductive materials.

14. The method of claim 11, wherein a taper angle of the top portion of the contact structure is less than a taper angle of the bottom portion of the contact structure measured from a horizontal plane.

15. The method of claim 11, wherein the inner spacer comprises a dielectric spacer material.

16. The method of claim 11, wherein an interface between the top portion and the bottom portion of the contact structure is located below a bottom surface of the inner spacer.

17. The method of claim 16, wherein the maximum width of the bottom portion of the contact structure is greater than a width of the interface between the top portion and the bottom portion of the contact structure.

18. The method of claim 11, wherein an interface between the top portion and the bottom portion of the contact structure is coplanar with a bottom surface of the inner spacer and an uppermost surface of the bottom portion of the contact structure.

19. A method of forming a semiconductor structure, comprising:
   conducting a first etching process within a dielectric material to form a first contact trench having a straight sidewall from a top to a bottom of the first contact trench;
   depositing an inner spacer on the straight sidewall from the top to the bottom of the first contact trench;
   conducting a second etching process to form a second contact trench below the first contact trench with the first contact trench including a tapering profile towards the second contact trench, wherein the second etching process is conducted until the second contact trench exposes an uppermost surface of an underlying active region;
   conducting a third etching process to horizontally extend the second contact trench, wherein a maximum width of the second contact trench is greater than a minimum width of the first contact trench;
   depositing a second metal stack from a bottom to a top of the second contact trench; and
   depositing a first metal stack within the first contact trench, the first metal stack being in contact with and surrounded by the inner spacer.

20. The method of claim 19, wherein a taper angle of the first contact trench is less than a taper angle of the second contact trench measured from a horizontal plane.

* * * * *